United States Patent [19]
Hsue et al.

[11] Patent Number: 5,436,186
[45] Date of Patent: Jul. 25, 1995

[54] PROCESS FOR FABRICATING A STACKED CAPACITOR

[75] Inventors: Chen-Chiu Hsue; Gary Hong; Ming-Tzong Yang, all of Hsin-Chu, Taiwan

[73] Assignee: United Microelectronics Corporation, Hsinchu, Taiwan

[21] Appl. No.: 231,516

[22] Filed: Apr. 22, 1994

[51] Int. Cl.6 .......................................... H01L 21/8242
[52] U.S. Cl. ........................................ 437/52; 437/60; 437/919
[58] Field of Search .................. 257/307, 308; 437/47, 437/48, 52, 60, 919

[56] References Cited

U.S. PATENT DOCUMENTS

| | | | |
|---|---|---|---|
| 5,021,357 | 6/1991 | Taguchi et al. | 437/52 |
| 5,053,351 | 10/1991 | Fazan et al. | 437/52 |
| 5,071,781 | 12/1991 | Seo et al. | 437/47 |
| 5,071,783 | 12/1991 | Taguchi et al. | 437/52 |
| 5,084,405 | 1/1992 | Fazan et al. | 437/52 |
| 5,142,639 | 8/1992 | Kohyama et al. | 357/23.6 |
| 5,155,657 | 10/1992 | Oehrleim et al. | 437/52 |
| 5,164,337 | 11/1992 | Ogawa et al. | 437/48 |
| 5,187,548 | 2/1993 | Baek et al. | 257/308 |
| 5,192,702 | 3/1993 | Tseng | 437/52 |
| 5,206,787 | 5/1993 | Fujioka | 257/307 |
| 5,223,729 | 6/1993 | Kodah et al. | 257/296 |
| 5,290,726 | 3/1994 | Kim | 437/48 |

OTHER PUBLICATIONS

"3-Dimensional Stacked Capacitor Cell for 16M and 64M DRAMs", IEDM, 1988, pp. 593-595, by T. Ema et al.

Primary Examiner—Tom Thomas
Attorney, Agent, or Firm—George O. Saile

[57] ABSTRACT

A method for fabricating a capacitors having a fin-shaped electrode on a dynamic random access memory (DRAM) cell having increased capacitance was achieved. The capacitor is fabricated on a silicon substrate having an active device region. The device region contains a metal-oxide-semiconductor field effect transistor (MOSFET), having one capacitor aligned over and contacting the source/drain of the MOSFET in the device region. The capacitor is increased in capacitance by forming a multilayer insulator structure over the storage capacitor area and recessing alternate layers, then using the form as a mold for forming a polysilicon fin-like bottom capacitor electrode. The remaining multilayer mold is removed and a high dielectric constant insulator is deposited on the bottom electrode as the inter-electrode dielectric. The top capacitor electrode is formed by depositing a doped polysilicon layer which also fills the recesses in the bottom electrode forming an interdigitized fin-shaped top and bottom capacitor electrodes and completing a dynamic random access memory (DRAM) cell.

10 Claims, 7 Drawing Sheets

PROCESS FOR FABRICATING A STACKED CAPACITOR

BACKGROUND OF THE INVENTION

1. Field of the Invention

This invention relates to a random access memory device and, more particularly, to a method of fabricating a three-dimensional stacked capacitors having increased capacitance.

2. Description of the Prior Art

The integrated circuit density on the semiconductor substrate and the semiconductor chips formed therefrom, has dramatically increased in recent years. This increased in density has resulted from down scaling of the individual devices built in and on the substrate and the increase in packing density. Future requirements for even greater increases in packing density is putting additional demand on the semiconductor technologies and more particularly on the photolithographic techniques.

One circuit type experiencing this demand for increased density is the array of charge storage cells on a dynamic random access memory (DRAM) chip. These individual DRAM storage cells, consisting usually of a single metal-oxide-semiconductor field-effect transistor (MOSFET) and a single capacitor are used extensively in the electronics industry for storing data. A single DRAM storage cell stores a bit of data on the capacitor as electrical charge.

As the array of cells increase on the DRAM chip and capacitor decrease in size, it becomes increasingly difficult to maintain sufficient charge on the storage capacitor to maintain an acceptable signal-to-noise level. These volatile storage cells also require more frequent refresh cycles in order to retain their charge.

since the storage capacitor must occupy an area limited by the cell size, in order to accommodate the array capacitors on the chip, it is necessary to explore alternative methods for increasing the capacitance without increasing the area that the capacitor occupies on the substrate surface.

Both a trench capacitor, formed in the substrate, and a stacked capacitor, formed on the surface and over the MOSFET, are being pursued for DRAM applications. The stacked capacitors has received considerable interest in recent years because of the variety of ways that its shape can be controlled to increase the capacitance without increasing the area it occupies on the substrate. This makes the stacked capacitor very desirable for DRAM application.

Numerous three-dimensional capacitor structures have been reported. For example, H-H. Tseng, U.S. Pat. No. 5,192,702 teaches methods of fabricating vertical sidewall capacitors and P. Fazan et al, U.S. Pat. No. 5,084,405 teaches methods of forming double ring stacked capacitors structures using sidewall spacer techniques.

However, one type of three-dimensional stacked capacitor structure receiving considerable interest is the capacitor having a fin shaped electrode extending upward and over the cell area. The potential of stacking increased number of fin structures on the electrode and thereby increasing further the capacitance is of much interest. For example, an early publication by T. Ema et al entitled "3-Dimensional Stacked Capacitor Cell for 16M and 64M DRAMS", International Electron Devices Meeting, 1988, pp 593-595, IEEE, report on the use of multilayers of polysilicon and insulators to form this capacitor structure. More recently, variation of this fin stacked capacitor structure have been proposed to improve earlier versions. see for example, U.S. Pat. Nos. 5,053,351, to P. Fazan, 5,021,357 to M. Taguchi, and 5,223,729 to C. Kudoh.

Most of these stacked fin capacitor structures require multiple deposition of conducting layers and insulating layers and additional etch steps. This additional processing in more than one processing system result in additional manufacturing cost and reduced reliability and yield. Another approach by Y. Kohyana et al U.S. Pat. No. 5,142,639 teaches a method of using alternate layers of dissimilar insulating layers and then laterally etches one of the insulating layers to form a template for forming thereon the bottom and top electrodes of the stacked fin capacitor. The other insulator remains in place on the final structure to support the capacitor structure.

Although there has been considerable work done to increase the capacitance area on these very small stacked fin shaped capacitors, it is still desirable to further improve these capacitors while retaining as simple a process as possible to maintain high chip yields, low cost and good reliability. This is especially true as the DRAM increase to 256 Mbits on a chip.

SUMMARY OF THE INVENTION

Accordingly, it is a principal object of this invention to provide a stacked capacitor having fin-shaped electrodes and increasing capacitance.

It is another object of the present invention to provide a method for fabricating these stacked capacitors using a multilayered insulator process.

It is still another object of the invention to increase the capacitance while maintaining a simple manufacturing process.

This invention addresses these objects by teaching a method for forming a multilayered stacked capacitor having the fin structure of the bottom electrode interdigitized with the fin structure of the top electrode. A thin inter-electrode insulator having a high dielectric constant is formed on the bottom electrode prior to depositing the top electrode.

In summary then, after forming an array of active device areas surrounded and isolated from each other by a relatively thick field oxide, a charge passing transistor is formed in each active device region. The transistor is usually a metal-oxide-semiconductor field-effect-transistor (MOSFET) having source/drain contacts. The gate electrode of the transistor is formed from a doped polysilicon layer, which is patterned using conventional photolithographic techniques and etching. The patterned polysilicon layer also serves as the word line conductors elsewhere on the DRAM chip. Next, a insulating layer, usually composed of silicon oxide ($SiO_2$) and silicon nitride ($Si_3N_4$), is formed over the MOSFET and word line polysilicon pattern and a contact opening is formed in the insulator to one of the two source/drain contacts. This contact is now used to make electrical contact to the bottom electrode of the stacked capacitor. The contact is commonly referred to as the storage capacitor node contact.

The bottom electrode of the stacked capacitor is then formed by depositing a multilayer of alternately two insulating layers having substantially differing etch rates. The number of insulating layers are variable and depend on the number of electrode fin structures required for the storage capacitor. The multilayered insulator is patterned forming an opening over and down to the source/drain contact that will be the node contact of the storage capacitor. The insulator of one type is isotropically etched laterally in the opening forming alternating recesses in the sidewall of the opening. The bottom electrode is now formed by depositing an electrically conducting material that conformably coats the opening and fills the recesses forming the bottom electrode having fin-shaped structures. The second insulator is now isotropically etched and the recesses between the fin structure of the bottom electrode are filled with a second electrically conducting material after a thin high dielectric insulator is formed on the surface of the bottom electrode, completing the storage capacitor.

The multilayered insulator can be formed sequentially in the same deposition system saving time and minimizing contamination. The multilayered insulator structure used as a mold to form the capacitor is completely gone when the final capacitor structure is completed. This reduces the vertical height of the stacked capacitor while maximizing the number of fins that can be formed.

BRIEF DESCRIPTION OF THE DRAWINGS

The objects and advantages of this invention are best understood by the following embodiments with reference to the attached drawings which are now briefly described.

DESCRIPTION OF THE PREFERRED EMBODIMENTS

Now in keeping with the objects of this invention, the method for forming the stacked capacitor with increased capacitance is covered in detail. The sequence of fabrication steps for the first embodiment are shown in FIGS. 1 to 7. This storage capacitors can be fabricated on a N-channel MOSFET structures which are currently used in the manufacture of DRAMs. Therefore, only a brief description of the MOSFET structure is given, sufficient for understanding the current invention.

It should also be well understood by one skilled in the art that by including additional process steps, in addition to those described in this embodiment, other types of devices can also be included on the DRAM chip, For example, P channel MOSFETs can be formed by providing N-Wells in the P substrate and complementary metal-oxide semiconductor (CMOS) circuits can also be formed therefrom.

Figure 1:
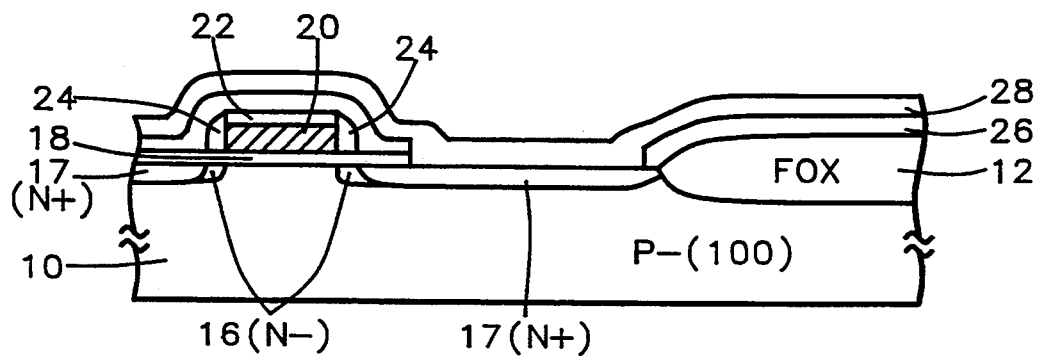
FIGS. 1 through 7 are schematic cross-sectional representation of the first embodiment of the method for fabricating the fin-type stacked capacitor of this invention on a conventional field effect transistor, commonly used in a DRAM storage cell.

Referring now to FIG. 1, a cross-sectional view of the substrate 10 having a partially completed DRAM cell formed on and in the substrate surface, is schematically shown. The preferred substrate is composed of a P-type single crystal silicon having a <100> crystallographic orientation. A relatively thick Field Oxide (FOX) 12 is formed around the active device regions to isolate these individual device regions. This field oxide, only partially shown in FIG. 1, is formed by depositing a thin silicon oxide (pad oxide) and a thicker silicon nitride layer as an oxidation barrier layer. Conventional photolithographic techniques and etching are then used to remove the barrier layer in areas where a field oxide is desired while retaining the silicon nitride in areas where active device are to be fabricated. The silicon substrate is then oxidized to form the field oxide. The preferred thickness is between about 4500 to 5500 Angstroms.

The semiconductor device is then formed in the active device regions after removing the silicon nitride barrier layer and pad oxide in a wet etch. The most commonly used device for dynamic random access memory is the metal-oxide-semiconductor field-effect transistor (MOSFET). This device is formed by first thermal oxidizing the active device region to form a thin gate oxide 18. The preferred thickness being from about 90 to 200 Angstroms. An appropriately doped polysilicon layer 20 and an insulating layer 22 are deposited and conventional photolithographic techniques and etching are used to pattern the insulating layer 22 and polysilicon layer 20. This forms the gate electrode 22 for the MOSFET in the active device regions and conducting patterns elsewhere on the substrate with the insulating layer 22 thereon. These conducting patterns form the word lines that electrically connect the MOSFET gate electrode to the appropriate peripheral circuits on the DRAM chip. The lightly doped source/drain 16 are formed next, usually by implanting a N-type dopant species such as arsenic or phosphorus. For example, a typical implant might consist of phosphorus $P^{31}$ at a dose of between 1 E 13 to 10 E 13 atoms/cm$^2$ and an energy of between about 30 to 80 Kev.

After forming the lightly doped source/drain, sidewall spacers 24 are formed on the gate electrode sidewalls. These sidewall spacers are formed by depositing a low temperature silicon oxide and anisotropically etching back to the silicon surface. For example, the silicon oxide could be a chemical vapor deposition using tetraethoxysilane (TEOS) at a temperature in the range of about 650° to 900° C. and the etch back performed in a low pressure reactive ion etcher. The N+ source/drain implantation is used to complete the source/drain regions 17. For example, arsenic ($As^{75}$) can be implanted at a dose of between 2 E 15 to 1 E 16 atoms/cm$^2$ and energy of between about 20 to 70 Kev. Alternatively, the source/drain contacts can be completed at a later process step whereby the dopant is out diffused from a doped polysilicon layer.

The remainder of this embodiment relates more specifically to the objects of this invention, which addresses now in detail the method of forming a fin-shaped bottom electrode for increasing the electrode area. The invention utilizes a multilayer insulating layer and an isotropic etch to form recesses for forming the fin-type bottom electrode.

Still referring to FIG. 1, the active device area having the MOSFET therein and the word lines elsewhere over the substrate are insulated by depositing a first insulating layer 26. The preferred insulator is a chemical vapor deposited (CVD) silicon oxide. The preferred thickness is between about 1000 to 2000 Angstroms. Using conventional photolithographic techniques and etching, an opening is formed in layer 26 to one of the source/drain contacts of the MOSFET. A second insulating layer 28 composed of silicon nitride is deposited over and in the contact opening and elsewhere on layer 26. The preferred thickness of layer 28 is between about 1000 to 2000 Angstroms and conventional CVD techniques are also used to deposit the silicon nitride.

Figure 2:
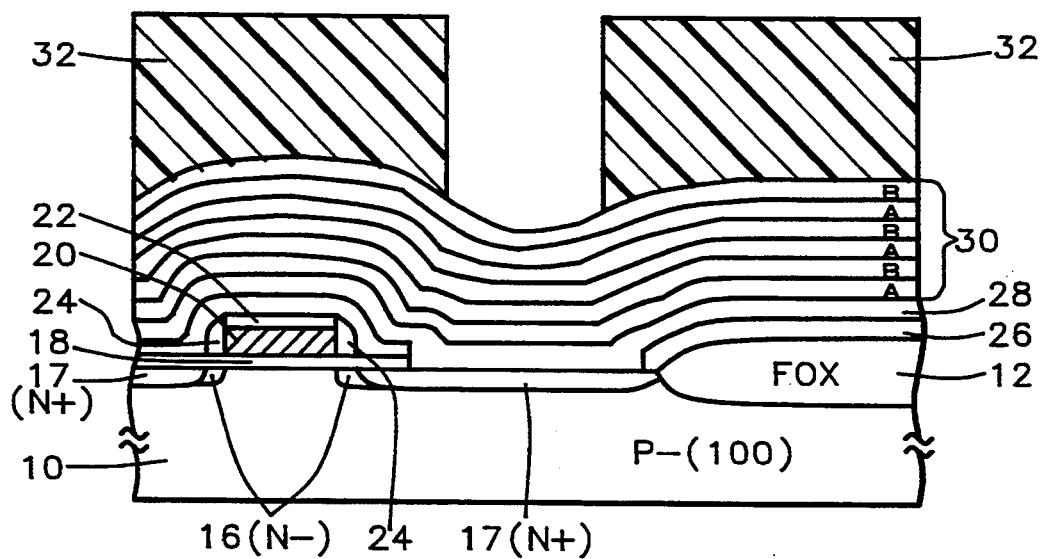

Referring now to FIG. 2, a multilayered structure 30 is deposited over layer 28 consisting of alternate layers of dissimilar materials, as labeled A and B in FIG. 2. The two materials having substantially different etch rates in a given solution or vapor phase etchant. The preferred materials are a phosphorous doped silicon oxide (PSG) for layers labeled A and silicon oxynitride (SiON) for layers labeled B. Alternatively, other dissimilar materials having large etch rate differences can also be used. For example, silicon oxide, silicon rich oxide and silicon nitride are other choices. The preferred method for depositing the PSG oxide and silicon oxynitride is an in situ multistep deposition process where the alternate layers are deposited sequentially by changing the deposition gas mixture in the process chamber. For example, an Applied Materials Corp. model P5000 deposition system utilizing a plasma enhanced chemical vapor deposition process can be used at a temperature of about 400° C. with a gas mixture of silane/oxygen/phosphine ($SiH_4/O_2/PH_3$) for depositing the phosphorus doped silicon oxide (PSG) and a gas mixture of silane/ammonia/nitrous oxide ($SiH_4/NH_3/N_2O$) for depositing the silicon oxynitride. The preferred thickness of the PSG layer labeled A is between about 500 to 2000 Angstroms and the silicon oxynitride layer labeled B is also between about 500 to 2000 Angstroms. For demonstration purposes only six layers are shown in FIG. 2, but it should be well understood by one skilled in the art that more or less layers can be used without departing from the spirit and scope of the invention.

Figure 3:
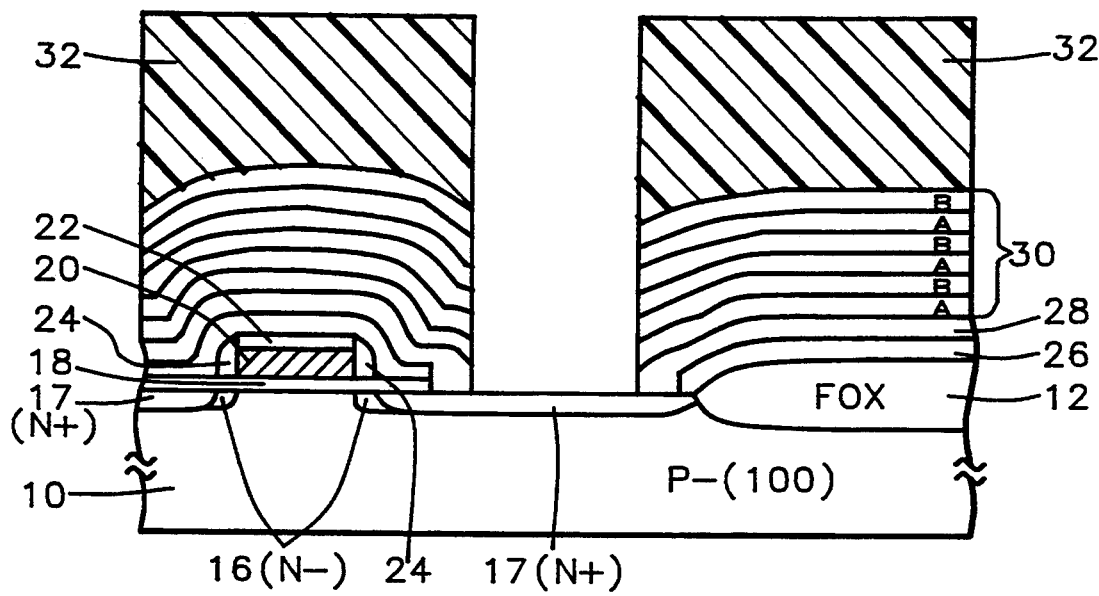

Referring still to FIG. 2, a conventional photolithography is used to form an etch mask 32 over the multilayered structure 30 and having the exposed area over and aligned to the source/drain area 17. The multilayer 30 and the nitride layer 28 are then etched to the source/drain area 17, providing for the node contact of the stacked capacitor, as depicted in FIG. 3. The anisotropic etch is preferably performed in a low pressure plasma etcher. For example, etching can be performed in a gas mixture of trifluoromethane and oxygen ($CHF_3/O_2$) at a pressure of 50 mTorr. One suitable etcher is an AME-8310 etcher manufactured by Applied Materials Corp. The contact opening in the multilayer 30 and layer 28 is formed smaller than the opening in the silicon oxide layer 26 so that portions of the silicon nitride layer 28 extends over and protects the silicon oxide layer 26 as also seen in FIG. 3. This is a critical step, since layer 26 must be protected from the isotropic etch that is later performed when the PSG layers, labeled A in FIG. 3, are recessed.

Figure 4:
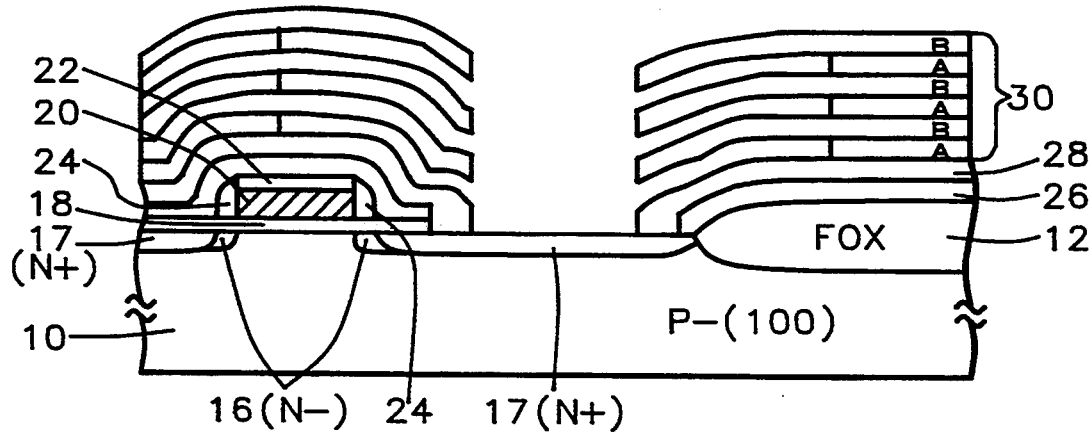

Referring now to FIG. 4, an isotropic etch is used to etch and thereby recess the alternate PSG layers A making up the multilayer 30 while leaving unetched the silicon oxynitride layer B. This forms a fin shaped profile in the sidewall of the opening in the multilayer 30. The preferred etchant is a buffered hydrofluoric acid (BOE) solution which etches the PSG oxide while leaving essentially unetched the oxynitride and silicon nitride layer 28. This fin shaped surface is now used to form the bottom electrode of the stacked capacitor.

Figure 5:
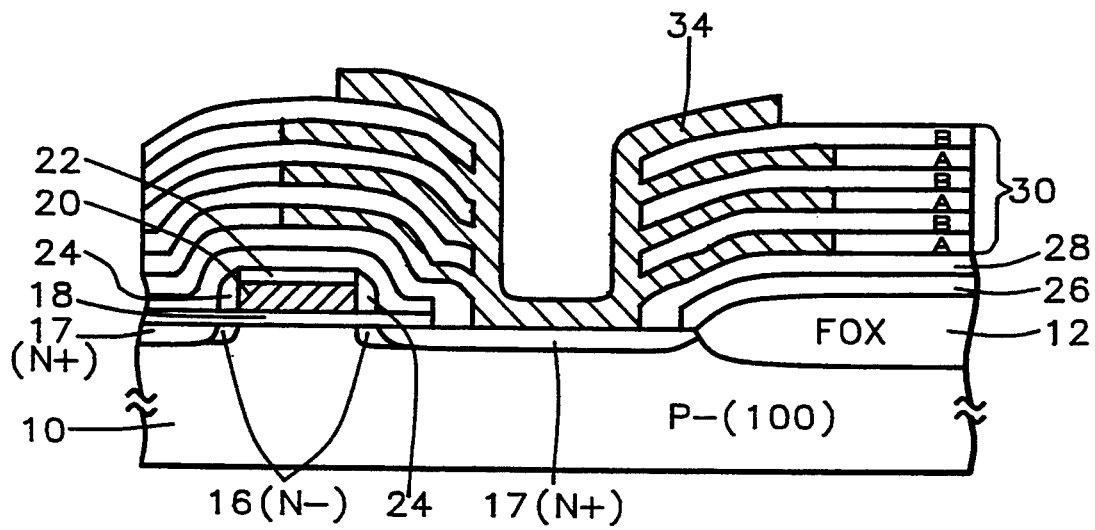

Then, as shown in FIG. 5, a first polysilicon layer 34 is deposited over the multilayer 30 and in the contact opening, contacting the source/drain area 17 and forming a conformal coating that fills the recesses in the sidewall of layer 30. The preferred polysilicon layer is deposited using a low pressure chemical vapor deposition (LPCVD) process and the polysilicon layer is in situ doped using a N-type impurity such a arsenic or phosphorous. The preferred thickness of layer 34 is between about 1000 to 3000 Angstroms and the dopant concentration between about 1 E 20 to 1 E 21 atoms/$cm^3$.

Conventional photolithographic techniques and reactive plasma etching are then used to patterned the first polysilicon layer 34 leaving portions over the source/drain area 17 and thereby forming the bottom electrode structure having a fin like shape, as shown in FIG. 5.

Figure 6:
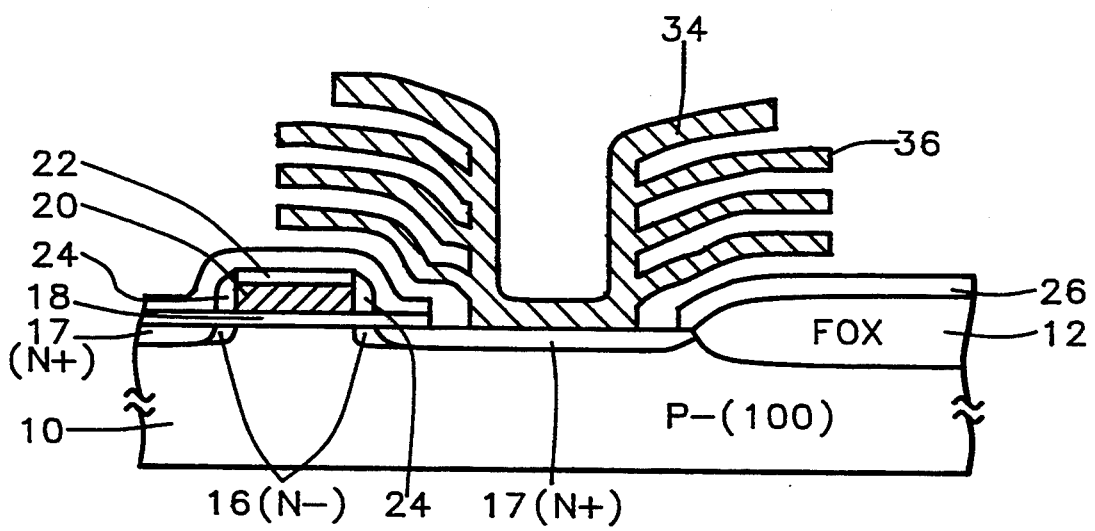

Referring next to FIG. 6, the insulating layers B, composed of silicon oxynitride, and the remaining layer A, composed of phosphorous doped silicon oxide (PSG), are removed in a BEO solution to form a free standing fin-shaped bottom electrode. Then silicon nitride layer 28 is etched in a hot phosphoric acid ($H_3PO_4$) solution having a temperature range between about 80° to 180° C.

Referring still to FIG. 6, a thin capacitor dielectric layer 36, having a high dielectric constant, is formed on and around the bottom electrode forming the inter-electrode dielectric and on the exposed surface of the source/drain area 17. Preferably the dielectric layer 36 is composed of a silicon oxide/silicon nitride layers having a total thickness of between about 40 to 150 Angstroms. The layer 36 being thin is not explicitly shown, but is indicated as being on the surface of layer 34 as seen in FIG. 6.

Figure 7:
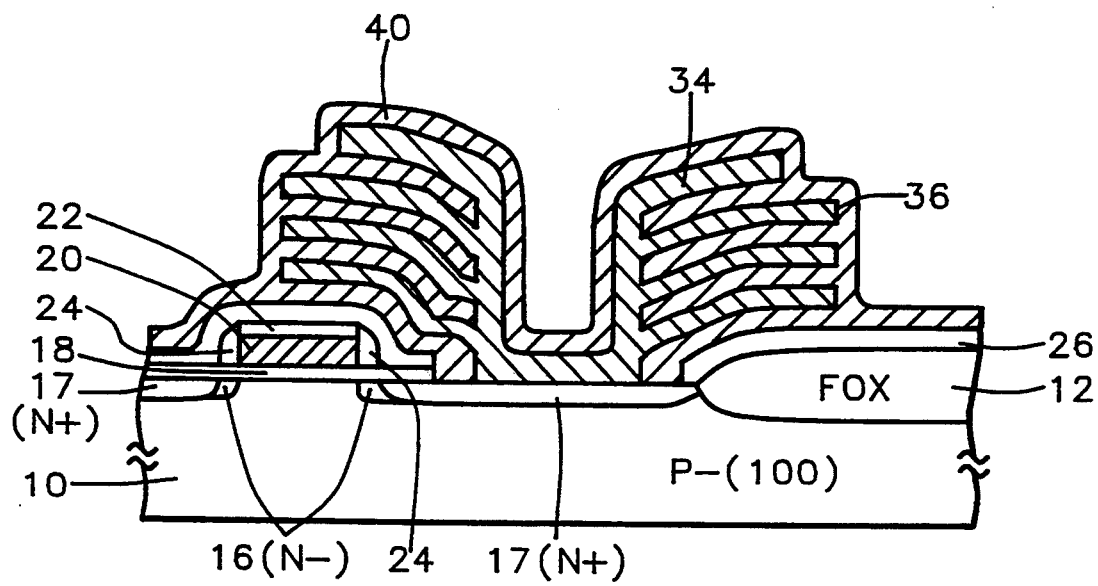

As shown in FIG. 7, a second polysilicon layer 40 is now deposited on, around and in the recesses of the bottom electrode and over the inter-electrode layer 36 forming the top electrode of the storage capacitor and completing the fin shaped storage capacitors. The preferred thickness of polysilicon 40 is from between about 1000 to 3000 Angstroms and is doped with N-type impurity, such as arsenic and phosphorus species. The preferred concentration being in the range between about 1 E 20 to 1 E 21 atoms/$cm^3$. Low pressure chemical vapor deposition and in-situ doping is used to deposit the conformal polysilicon layer 40.

Although the formation of the bit line contact and the bit line metallurgy are not presented in this embodiment it should be well understood by one skilled in the art that by including additional process steps that the bit line contact and the bit line can be formed either prior to or after the capacitor is fabricated as is commonly reported in the literature and practice in the industry.

Referring now more particularly to FIGS. 8 through 13, there is shown a second embodiment of the method for forming a storage capacitor having a fin shaped electrode structure on a field effect transistor. Many of the process steps and structure are similar to the first embodiment and therefore the same numbers will be used where like structure exist. The method is identical up to the first insulating 26 and therefore is not repeated here.

Figure 8:
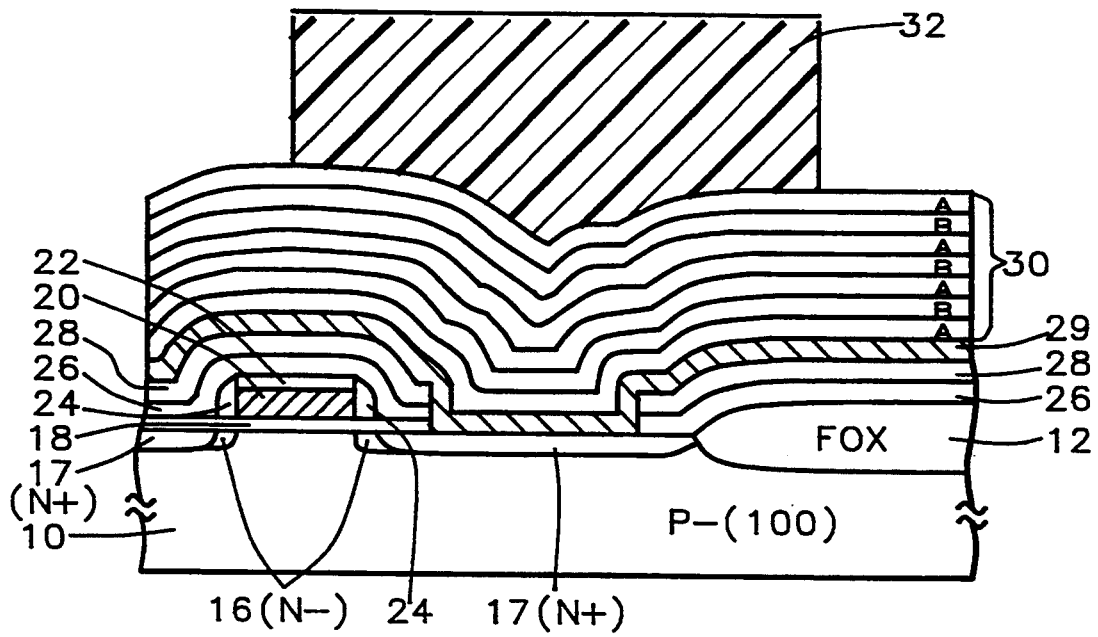
FIGS. 8 through 13 are schematic cross-sectional representation of the second embodiment of the method for fabricating the fin-type stacked capacitor of this invention on a conventional field effect transistor commonly used in a DRAM storage cell.

Referring now to FIG. 8, as in the first embodiment a first insulating layer 26 is deposited over the device area having a MOSFET therein and over the word line and elsewhere over the substrate. The first insulating layer 26 is preferably silicon oxide having a thickness between about 1000 to 2000 Angstroms. Also seen in FIG. 8, a second insulating layer 28 is deposited over layer 26 composed of have a substantially different material and having a substantially different etch rate. The preferred material is silicon nitride (Si3N4) and conventional CVD can be used to deposit the layer. The preferred thickness is between about 500 to 2000 Angstroms.

Still referring to FIG. 8, conventional photolithographic techniques and etching are used to form an opening in layers 26 and 28 over the source/drain area of the MOSFET. A first polysilicon layer 29 is deposited over layer 28 and in the contact opening forming a portion of the capacitor bottom electrode that makes electrical contact to the source/drain of the MOSFET. The preferred deposition for the polysilicon layer 29 is a low pressure chemical vapor deposition (LPCVD) technique having a thickness of between about 500 to 1500 Angstroms. The polysilicon layer is then doped with N-type dopant impurities, such as arsenic of phosphorous, by implantation. Alternatively the layer 29 can be in situ doped. The preferred concentration is between about 1 E 20 to 1 E 21 atoms/cm$^3$.

Next, as shown in FIG. 8, a multilayered structure 30 is formed over the polysilicon layer 29 composed of alternate layers of dissimilar materials having substantially different etch rates. The alternate layers are labeled A and B in FIG. 8. The preferred material of layers labeled A is silicon oxynitride and those labeled B is PSG oxide. Alternately, other combinations of materials having substantially different etch rates can be used. For example, silicon oxide and silicon nitride or silicon oxide and silicon rich oxide (SRO).

Figure 9:
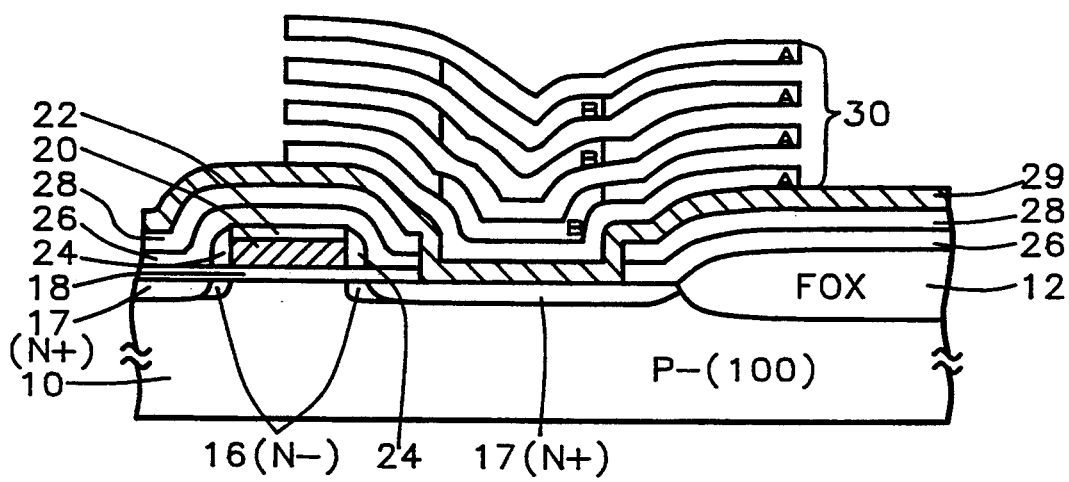

Referring now to FIG. 9, the patterned multilayer 30 is formed over the capacitor area and the photoresist layer 32 is removed, the alternate layers labeled B in FIG. 8 and composed of PSG are selective etched, leaving unetched layers A composed of silicon oxynitride. This forms a fin-shaped structure in the multilayered structure 30. The preferred etchant is a buffered hydrofluoric acid (BEO) solution. This etch step is critical and the etching is stopped so as to leave a portion of the PSG oxide layer B remaining at the center of the multilayer 30, as shown in FIG. 9.

Figure 10:
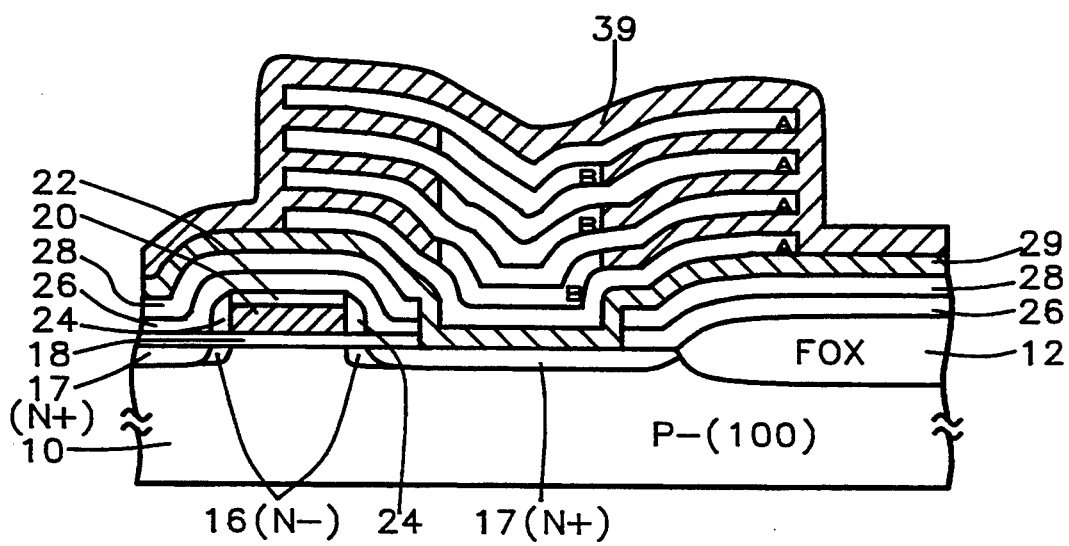

Referring now to FIG. 10, a second polysilicon layer 39 is deposited over, around and in the recesses in the multilayered structure 30 forming the bottom electrode having a fin-shaped structure. The layer 39 is over and contacting the first polysilicon layer 29. The preferred deposition for layer 39 is a LPCVD technique having a thickness of between about 1000 to 3000 Angstroms. Polysilicon layer 39 is also in situ doped N-type. The preferred dopant is arsenic or phosphorous and having a concentration between about 1 E 20 to 1 E 21 atoms/cm$^3$.

Figure 11:
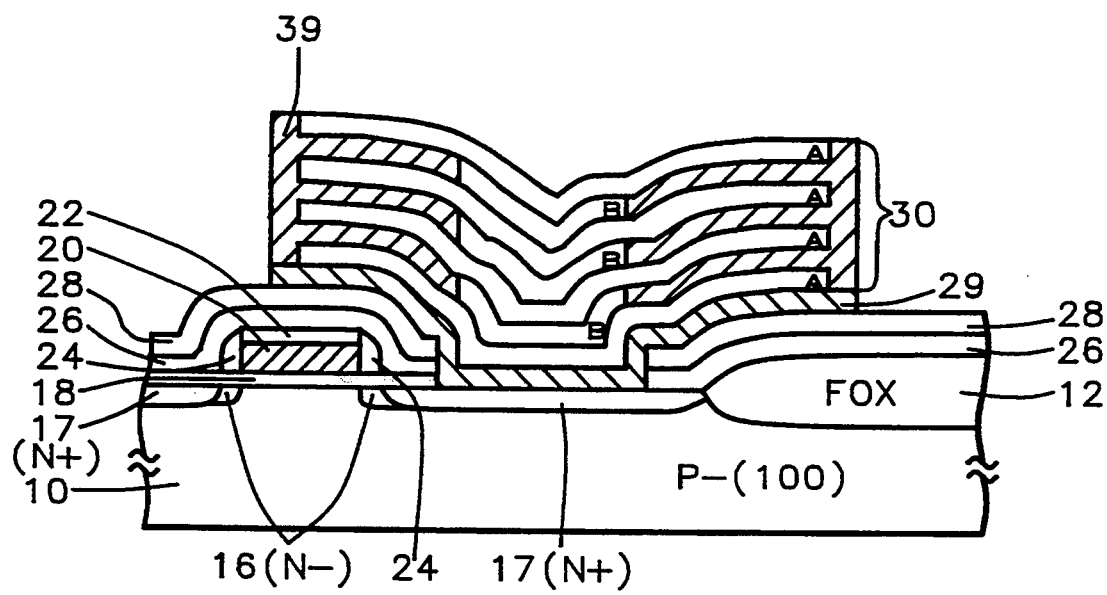

As shown in FIG. 11, the second polysilicon layer 39 is now anisotropically etched back exposing the silicon oxynitride top layer labeled A of the multilayered structure 30. The first polysilicon layer 29 outside the capacitor area is also removed in this same etch step exposing the silicon nitride (Si3N4) insulating layer 28 elsewhere on the substrate surface. This etch back results in a bottom electrode that has polysilicon sidewalls with fin-shaped portion extending inward over the capacitor area. The etch back also electrically isolates the individual bottom electrode from the array of other electrodes that are formed concurrently on the substrate. However, only one of the electrodes is depicted in the figures.

Figure 12:
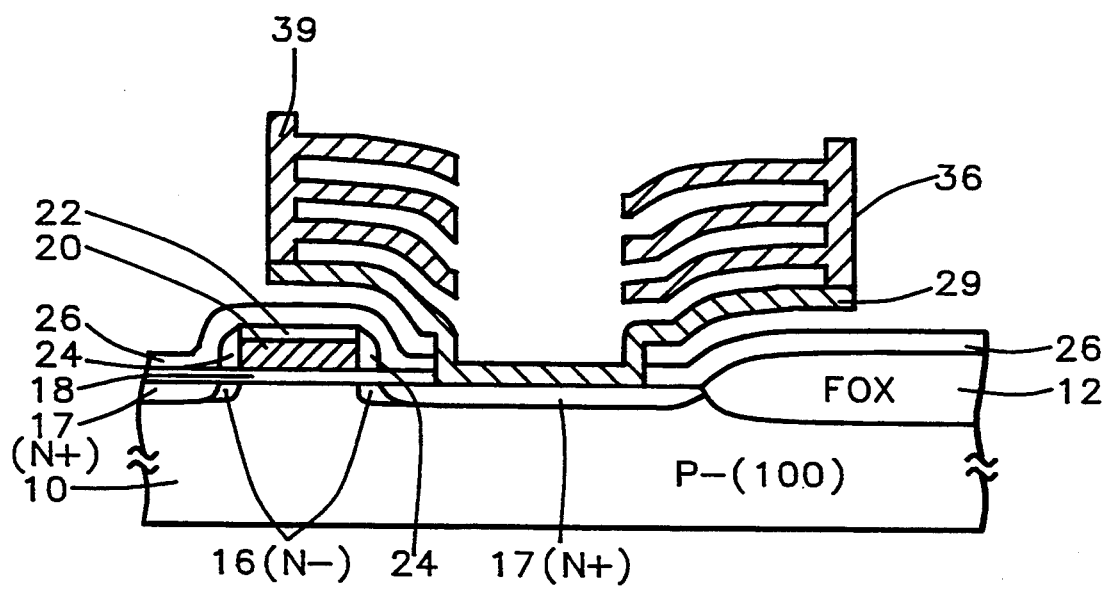
Figure 13:
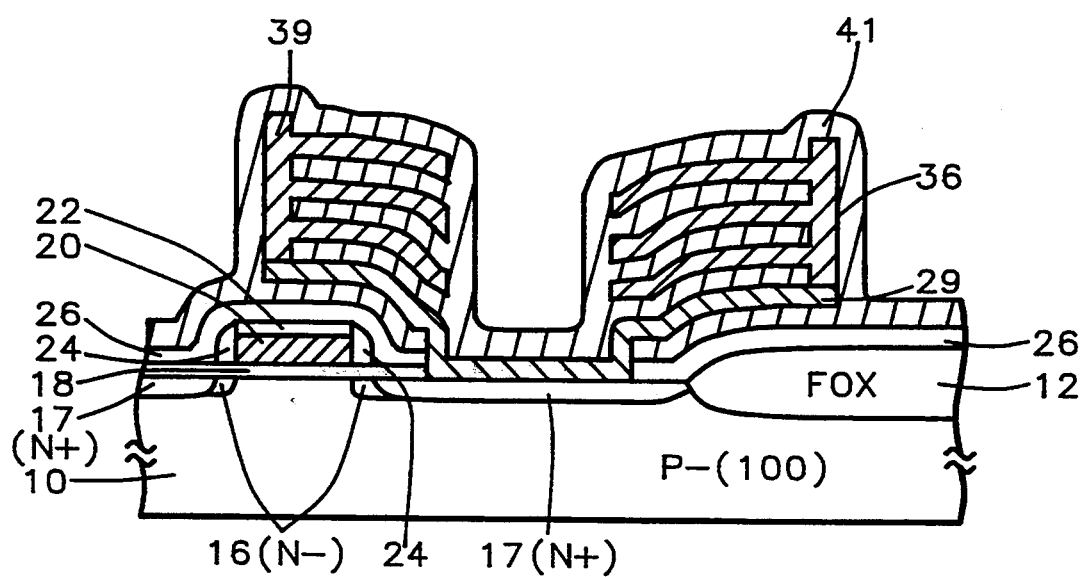

Now referring to FIG. 12, the remaining multilayered structure 30, composed of layer A and B, is removed leaving a free standing bottom electrode having a fin-shaped structure formed from layers 29 and 39. The silicon nitride layer 28 is also removed under the bottom electrode further increasing the surface area of the bottom electrode. The silicon oxynitride layer labeled A and PSG layer labeled B shown in FIG. 11 are removed in a suitable etching solution, such as a dilute hydrofluoric acid for etching the PSG layers and a hot phosphoric acid solution for etching silicon nitride layer 28.

The capacitor dielectric layer 36 is now formed over the bottom electrode composed of polysilicon layers 39 and 29. The dielectric layer 36 is usually composed of silicon nitride and silicon oxide (NO) or layers of silicon oxide, silicon nitride and silicon oxide (ONO). The dielectric layer is not shown in FIG. 12 as a separate layer, but is indicated as existing at the surface of layer 39 by the number 36.

The top capacitor electrode is now formed by depositing a third polysilicon layer 41 over the capacitor dielectric layer 36 and conformably coating the fin-shaped bottom capacitor electrode and completing the stacked storage capacitor. The preferred thickness of the polysilicon layer 41 is between about 1000 to 3000 Angstroms and the layer is doped N-type with a preferred concentration of 1 E 20 to 1 E 21 atoms/cm$^3$.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a high capacitance stacked storage capacitor over a semiconductor substrate having device areas and word lines formed therein comprising the steps of:

depositing a first insulating layer on said device areas, word lines and elsewhere on said substrate;

depositing a second insulating layer on said first insulating layer being of different composition from said first insulating layer;

forming an opening in said first and second insulating layers for said storage capacitor node contact over and to said device area;

depositing a first polysilicon layer over said second insulating layer and over and in said opening in said first and second insulating layer;

depositing on said first polysilicon layer a multilayer of two insulator types having alternate layers composed of one insulator type and the other layers composed of the second insulator type;

patterning said multilayer having portions over said storage capacitor area and removing portions elsewhere on said first polysilicon layer and said substrate, said multilayer portions having vertical sidewalls;

selectively etching one insulator type and leaving said other insulator type unetched in said sidewall of said multilayer and forming a multiple of fin-shaped recesses in said sidewall;

depositing a second polysilicon layer over and in said multilayer patterns and in said sidewall recesses forming fin-shaped polysilicon structures and making electrical contact for said storage capacitor to said device area;

anisotropically etching back said second and first polysilicon layer and exposing top portions of said multilayer patterns over said storage capacitor area and leaving portions of said second polysilicon on sidewall and in recesses of said multilayer structure and forming a polysilicon multiple fin structure;

etching completely and isotropically said multilayer structure and leaving free standing said polysilicon multiple fin structure and thereby forming the bottom electrode of said storage capacitor;

depositing a dielectric layer over said bottom electrode and forming an inter-electrode insulating layer;

depositing a third polysilicon layer over said dielectric layer forming the top capacitor electrode and completing said stacked storage capacitor having a fin-shaped structure.

2. The method of claim 1, wherein said first insulating layer is composed of silicon oxide having a thickness of between about 1000 to 2000 Angstroms.

3. The method of claim 1, wherein said second insulating layer is composed of silicon nitride having a thickness of between about 500 to 2000 Angstroms.

4. The method of claim 1, wherein said multilayer is composed of at least two layers and are alternately deposited.

5. The method of claim 4, wherein said layers are of at least two different compositions with different etch rates in the same etchant.

6. The method of claim 5, wherein said layers are phosphorous doped silicon oxide having a thickness of between about 500 to 2000 Angstroms and silicon oxynitride having a thickness between about 500 to 2000 Angstroms.

7. The method of claim 1, wherein said first polysilicon layer is doped with N-type impurities and has a thickness between about 500 to 1500 Angstroms.

8. The method of claim 1, wherein said capacitor dielectric is silicon nitride and silicon oxide having a total thickness of between about 30 to 150 Angstroms.

9. The method of claim 1, wherein said second and third polysilicon layer are doped with N-type impurities and having a thickness of between about 1000 to 3000 Angstroms.

10. The method of claim 1, wherein said bottom electrode of said storage capacitor makes electrical contact to the source/drain of a field effect transistor in said device area and together comprise a dynamic random access memory cell.

* * * * *